(12) United States Patent
Jin

(10) Patent No.: US 10,001,649 B2
(45) Date of Patent: Jun. 19, 2018

(54) DISPLAY DEVICE AND HEAD-MOUNTED DISPLAY APPARATUS

(71) Applicants: Shanghai AVIC OPTO Electronics Co., Ltd., Shanghai (CN); Tianma Micro-electronics Co., Ltd., Shenzhen (CN)

(72) Inventor: Huijun Jin, Shanghai (CN)

(73) Assignees: SHANGHAI AVIC OPTO ELECTRONICS CO., LTD., Shanghai (CN); TIANMA MICRO-ELECTRONICS CO., LTD., Shenzhen (CN)

(*) Notice: Subject to any disclaimer, the term of this patent is extended or adjusted under 35 U.S.C. 154(b) by 82 days.

(21) Appl. No.: 15/254,842

(22) Filed: Sep. 1, 2016

(65) Prior Publication Data

US 2017/0357091 A1    Dec. 14, 2017

(30) Foreign Application Priority Data

Jun. 14, 2016 (CN) .......................... 2016 1 0421066

(51) Int. Cl.
*G09G 5/00* (2006.01)
*G02B 27/01* (2006.01)
(Continued)

(52) U.S. Cl.
CPC ..... *G02B 27/0172* (2013.01); *G02B 27/0176* (2013.01); *G02F 1/133514* (2013.01); *G02F 1/133621* (2013.01); *G06T 3/40* (2013.01); *G06T 7/408* (2013.01); *G06T 19/006* (2013.01); *G09G 3/2003* (2013.01); *G09G 3/3208* (2013.01); *H01L 27/322* (2013.01); *G02B 2027/0112* (2013.01);
(Continued)

(58) Field of Classification Search
CPC ........ G02B 27/0172; G02B 2027/0112; G02B 2027/0147; G02B 27/0176; G02F 1/133514; G02F 1/133621; G06T 7/408; G06T 19/006; G06T 3/40; H01L 27/322; G09G 2320/0626; G09G 2320/0666; G09G 3/3208; G09G 3/2003
See application file for complete search history.

(56) References Cited

U.S. PATENT DOCUMENTS 8,605,017 B2 * 12/2013 Brown Elliott ... G02F 1/133621
345/102
2002/0131022 A1 * 9/2002 Shibatani ............. H04N 9/3108
353/31

(Continued)

FOREIGN PATENT DOCUMENTS

CN    1132039 C    12/2003
CN    1501123 A    6/2004

*Primary Examiner* — Erin M File
(74) *Attorney, Agent, or Firm* — Anova Law Group, PLLC

(57) ABSTRACT

A display device and a head-mounted display apparatus are provided. The display device comprises a display unit and a first optical module. The display unit further comprises a plurality of display areas, and each display area includes a plurality of pixel units. Display colors of pixel units in each display area are the same, and the display colors of pixel units in different display areas are different. The first optical module is configured to converge and overlap image light of the plurality of display areas to form a display image.

18 Claims, 11 Drawing Sheets

(51) Int. Cl.
*G06T 7/40* (2017.01)
*G06T 19/00* (2011.01)
*G09G 3/3208* (2016.01)
*G09G 3/20* (2006.01)
*G06T 3/40* (2006.01)
*G02F 1/1335* (2006.01)
*H01L 27/32* (2006.01)

(52) U.S. Cl.
CPC ........... *G02B 2027/0147* (2013.01); *G09G 2320/0626* (2013.01); *G09G 2320/0666* (2013.01)

(56) References Cited

U.S. PATENT DOCUMENTS

| | | | | |
|---|---|---|---|---|
| 2004/0165263 | A1* | 8/2004 | Sudo | H04N 13/0409 359/462 |
| 2008/0035836 | A1* | 2/2008 | Lee | H01L 27/14621 250/226 |
| 2008/0151354 | A1* | 6/2008 | Mehrl | G02B 26/0833 359/292 |
| 2014/0300711 | A1* | 10/2014 | Kroon | H04N 13/0033 348/51 |
| 2014/0361264 | A1* | 12/2014 | Choi | H01L 51/5275 257/40 |
| 2017/0186382 | A1* | 6/2017 | Chen | G09G 3/3607 |
| 2017/0255020 | A1* | 9/2017 | Tam | G02B 27/0179 |

\* cited by examiner

DISPLAY DEVICE AND HEAD-MOUNTED DISPLAY APPARATUS

CROSS-REFERENCES TO RELATED APPLICATIONS

This application claims priority of Chinese Patent Application No. 201610421066.7, filed on Jun. 14, 2016, the entire contents of which are hereby incorporated by reference.

FIELD OF THE INVENTION

The present disclosure generally relates to the field of display technology and, more particularly, relates to a display device and a head-mounted display apparatus thereof.

BACKGROUND

With the continuous development of science and technologies, in the field of display technology, head-mounted visual display apparatus have gained extensive popularity among users. In recent years, due to advantages including a strong sense of immersion, good privacy, and superior portability, head-mounted display apparatus that display and reinforce virtual reality have become popular products in the display-oriented field. A head-mounted display apparatus may be applied in areas like 3D movies, video games, and sports, or may be used in high-end applications such as scientific research, flight training, and immersive entertainment.

In current markets, a head-mounted visual display apparatus often has a complex structure, and a high-quality process is often required to produce such an apparatus. However, given a limited budget, it can be rather difficult to produce a head-mounted visual display apparatus with a high resolution, which often requires a complicated optical amplification system and a high cost. Further, after an image is enlarged, the image may be very granular and shows apparent pixel dots, which significantly lowers the quality of the image.

The disclosed display device and head-mounted display apparatus are directed to solve one or more problems set forth above and other problems.

BRIEF SUMMARY OF THE DISCLOSURE

One aspect of the present disclosure provides a display device. The display device comprises a display unit and a first optical module. The display unit further comprises a plurality of display areas, and each display area includes a plurality of pixel units. Display colors of pixel units in each display area are the same, and the display colors of pixel units in different display areas are different. The first optical module is configured to converge and overlap image light of the plurality of display areas to form a display image.

Another aspect of the present disclosure provides a head-mounted display device. The head-mounted display device include a display device comprising a display unit and a first optical module. The display unit further comprises a plurality of display areas, and each display area includes a plurality of pixel units. Display colors of pixel units in each display area are the same, and the display colors of pixel units in different display areas are different. The first optical module is configured to converge and overlap image light of the plurality of display areas to form a display image.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Reference will now be made in detail to exemplary embodiments of the invention, which are illustrated in the accompanying drawings. Hereinafter, embodiments consistent with the disclosure will be described with reference to drawings. Wherever possible, the same reference numbers will be used throughout the drawings to refer to the same or like parts. It is apparent that the described embodiments are some but not all of the embodiments of the present invention. Based on the disclosed embodiments, persons of ordinary skill in the art may derive other embodiments consistent with the present disclosure, all of which are within the scope of the present invention. Further, in the present disclosure, the disclosed embodiments and the features of the disclosed embodiments may be combined or separated under conditions without conflicts.

As discussed above, given a limited budget, it can be rather difficult to produce a head-mounted visual display apparatus with a high resolution, which often requires a complicated optical amplification system and a high cost. Further, after an image is enlarged, the image may be very granular and shows apparent pixel dots, which significantly lowers the image quality.

The present disclosure provides an improved display device and an improved head-mounted display apparatus thereof. The disclosed display device may show a relatively simple structure which requires a relatively low processing precision and reduces the production cost. Further, the disclosed head-mounted display apparatus may not only possess functionality of a complicated optical amplification system, but may also improve the quality of display images.

Figure 1A:
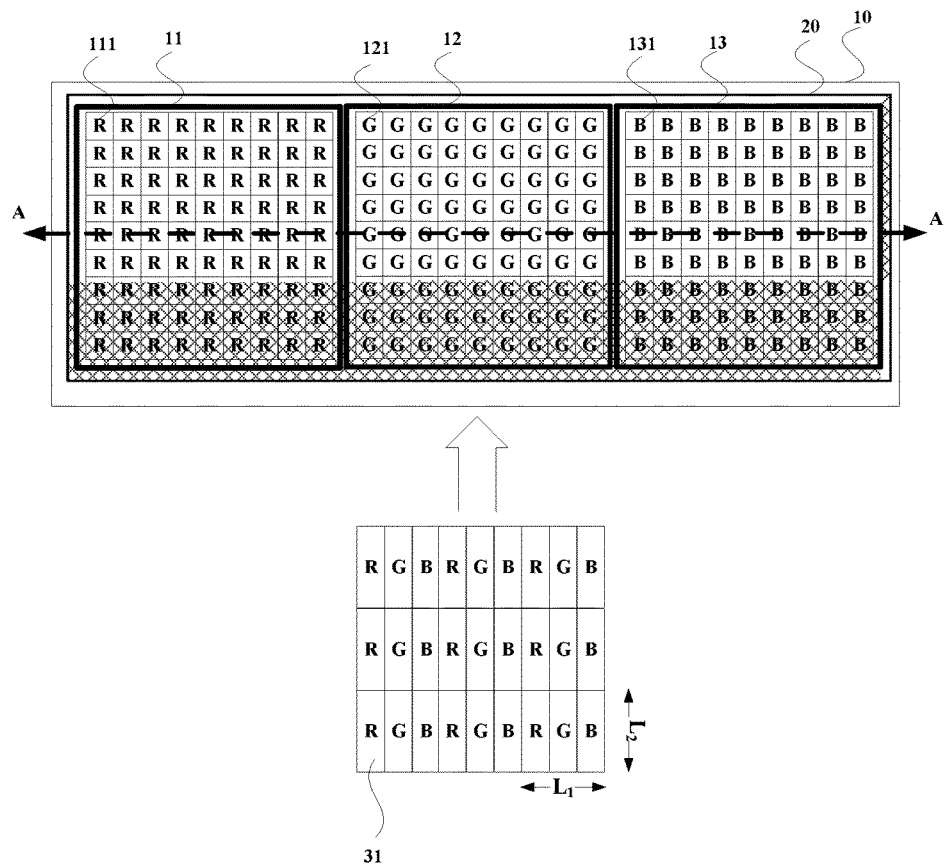
FIG. 1A illustrates an exemplary display device consistent with disclosed embodiments in comparison to an existing display panel.

In one embodiment, FIG. 1A illustrates an exemplary display device in comparison to an existing display panel. The upper portion of FIG. 1A shows a disclosed display device, and the lower portion of FIG. 1A shows an existing display panel. As shown in FIG. 1A, an existing display panel may include a plurality of pixel units 31 arranged in a matrix, and pixel units in every three different colors form a periodic arrangement. Specifically, in each line, red pixel units (R), green pixel units (G), and blue pixel units (B) may be periodically arranged. The length ($L_1$) of three pixel units 31 along a row direction may be equal to the length of a single pixel unit 31 along a column direction. The fabrication process of the existing display panel may be relatively complicated due to the periodic arrangement of pixel units in different colors. Because users are expecting display panels with higher resolutions, a dimension of a single pixel unit may need to be decreased. Accordingly, a size limit of pixel units during fabrication and processing may restrict the improvement of display panel resolution.

Figure 1B:
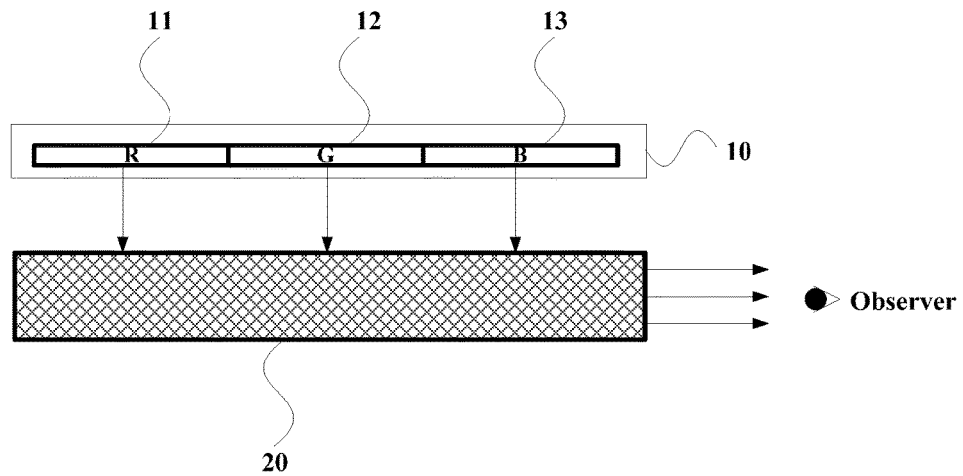
FIG. 1B illustrates an AA cross-sectional view of an exemplary display device in FIG. 1A consistent with disclosed embodiments.

FIG. 1B illustrates an AA cross-sectional view of an exemplary display device in FIG. 1A. As shown in FIG. 1A and FIG. 1B, the disclosed display device may include a display unit 10, and a first optical module 20. The display unit 10 may include a plurality of display areas, for example, FIG. 1A illustrates three display areas: a display area 11, a display area 12, and a display area 13. Each display area may include a plurality of pixel units. In each display area, display color of the pixel units may be the same. In different display areas, display colors of the pixel units may be different.

For example, a display color of pixel units 111 in the display area 11 may be red (R), a display color of pixel units 121 in the display area 12 may be green (G), and a display color of pixel units 131 in the display area 13 may be blue (B). As shown in FIG. 1A, the pixel units 111 in the display area 11 and the pixel units 121 in the display area 12 may have different display colors, the pixel units 121 in the display area 12 and the pixel units 131 in the display area 13 may have different display colors, the pixel units 111 in the display area 11 and the pixel units 131 in the display area 13 may have different colors. The first optical module 20 may be used to converge and overlap lights of an image in a plurality of display areas (the display area 11, the display area 12, and the display area 13) to form a display image.

In one embodiment, pixel units in different display colors may be disposed in different display areas, data signals in different display colors may be transmitted to different display areas of a display unit, respectively, and form a plurality of relatively independent images in different display areas. Image contents formed in each display area may be the same; however, image colors may be different. The first optical module may converge and overlap a plurality of images with the same content but different image colors in different display areas to form a colored display image.

Compared to existing display panels, the disclosed display device may divide a display unit into a plurality of display areas, and different display areas may show different color images. Accordingly, a fabrication process of the display device may not be restricted by a dimension of a single pixel unit, thus the disclosed embodiment may lower a requirement of processing precision and reduce difficulty in fabricating the display unit. Further, while data signals of pixel units in different display colors may cross with each other in existing technologies, the disclosed display device may transmit data signals in different display colors to different display areas in the display unit to form a plurality of relatively independent images in the different display areas, and a data signal transmission method may be simple. When displaying a single-colored image, only data lines in a corresponding colored display area may be supplied with data signals.

As shown in FIG. 1A, in the disclosed display device, if the length of pixel units along the row direction is equal to the length of pixel units along the column direction, and the lengths of pixel units (the pixel units 111, the pixel units 121, and the pixel units 131) along the row direction are equal to the length of pixel units 31 in the existing display panel along the row direction, the resolution of the disclosed display device may be three times as the resolution of the existing display panel. Thus, the image quality may be significantly improved.

The number of pixel units corresponding to a plurality of display areas in the disclosed display device may be the same, or may be different. To avoid the problem that, when converging and overlapping, the image light of different display areas may shift, thus resulting in a poor image quality, the number of pixel units corresponding to the plurality of display areas may be the same. For example, in FIG. 1A, the display area 11, the display area 12, and the display area 13 may all display 81 pixel units.

To avoid distorted display images and an imbalanced image ratio, the shape of the disclosed pixel units may be a square.

In one embodiment, the number of display areas may be larger than or equal to 3, and the display colors of pixel units in each disclosed display area may be mixed to display the white color. For example, if three primary colors are used, the number of display areas may be three, and the display colors of the pixel units in each display area may be red (R), green (G), and blue (B), respectively.

Figure 2:
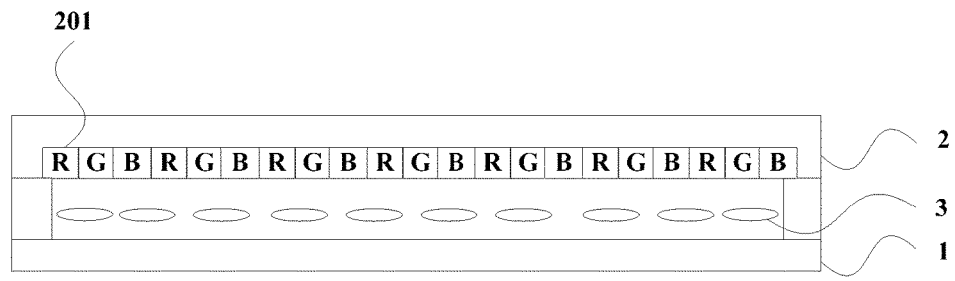
FIG. 2 illustrates an existing liquid crystal display panel.

The display unit in the disclosed display device may be a liquid crystal display panel, or may be an organic light emitting diode (OLED) display panel. FIG. 2 illustrates an existing liquid crystal display panel. As shown in FIG. 2, the liquid crystal display panel often includes a TFT array substrate 1, a color film substrate 2 arranged opposite to the TFT array substrate 1, and a liquid crystal layer sandwiched between the array substrate 1 and the color film substrate 2. To display a color image, the color film substrate 2 may also include an array of color barrier units 201.

Each color barrier unit may correspond to a pixel unit in the array substrate 1. Since the requirement of display panel resolution increases, the dimension of a single pixel unit may decrease and, accordingly, the requirement of precision in fabricating the array of color barrier units 201 may increase. The fabrication precision of the array of color barrier units 201 may further limit the improvement of resolution of the liquid crystal display panel.

Figure 3:
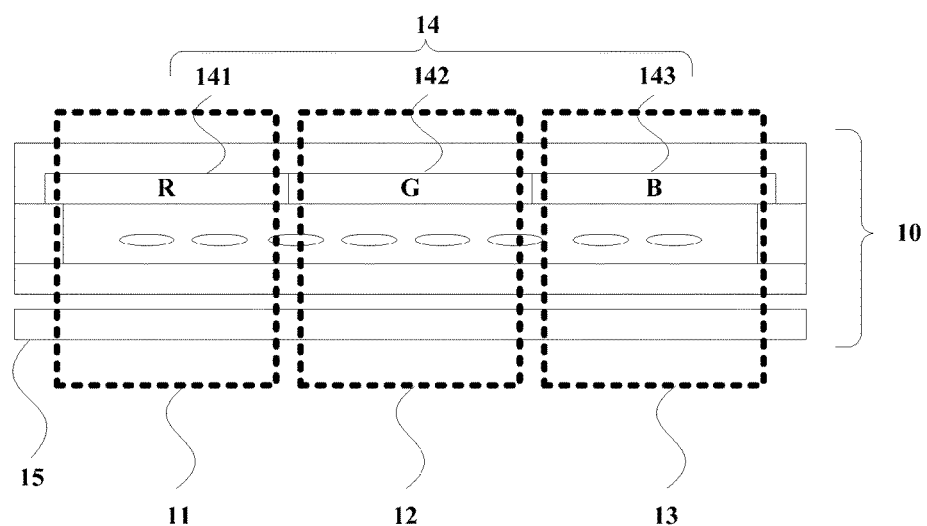
FIG. 3 illustrates an exemplary display unit consistent with disclosed embodiments.

FIG. 3 illustrates an exemplary display unit. As shown in FIG. 3, the disclosed display unit 10 may include a plurality of display areas: the display area 11, the display area 12, and the display area 13. Each display area (the display area 11, the display area 12, and the display area 13) may include a plurality of pixel units (not illustrated in FIG. 3). The display colors of the pixel units in the same display area (the display area 11, the display area 12, and the display area 13) may be the same, and the display colors of the pixel units in different display areas (the display area 11, the display area 12, and the display area 13) may be different.

The display unit 10 in FIG. 3 may be a liquid crystal display panel. For the display unit 10 to display normal color images, a color barrier layer 14 may be disposed on the light-emitting side of the display unit 10. The color barrier layer 14 may include a plurality of color barrier areas in different colors, each color barrier area may correspond to one display area, and a color of the color barrier area may be the display color of the pixel units in the corresponding display area.

After lights traverse color barrier areas in different colors, the lights may display corresponding colors. Further, the lights may be mixed to display other colors and show different color variations, thus realizing the display of color images.

As shown in FIG. 3, the display colors of the pixel units in the display area 11, the display area 12, and the display area 13 may be red (R), green (G), and blue (B), respectively. Correspondingly, the color barrier layer 14 may include three color barrier areas, namely, a color barrier area 141 (R), a color barrier area 142 (G), and a color barrier area 143 (B). The color barrier area 141 may correspond to the display area 11, the color barrier area 142 may correspond to the display area 12, and the color barrier area 143 may correspond to the display area 13. Since the display unit 10 is a liquid crystal display panel and liquid crystal itself may not emit light, a backlight source 15 may be required to provide backlight. As shown in FIG. 3, the disclosed display unit 10 may also include the backlight source 15, and the color of lights emitted by the backlight source 15 may be white.

Compared to the liquid crystal display panel in FIG. 2, the disclosed display unit may have a lower requirement of precision for color barriers when fabricating the display panel. Further, fabrication of a color barrier unit array may not be required. Specifically, each display area may only need to be equipped with a single corresponding color barrier area. Accordingly, the fabrication process may be simplified, the yield may be improved, and the production cost may be reduced.

Figure 4:
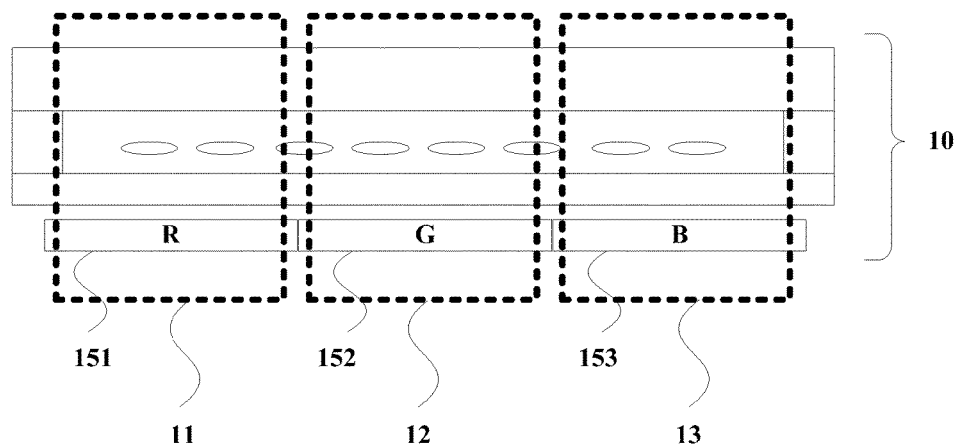
FIG. 4 illustrates another exemplary display unit consistent with disclosed embodiments.

FIG. 4 illustrates an exemplary display unit. As shown in FIG. 4, the disclosed display unit 10 may include a plurality of display areas: the display area 11, the display area 12, and the display area 13. Each display area (the display area 11, the display area 12, and the display area 13) may include a plurality of pixel units. The display colors of the pixel units in each display area (the display area 11, the display area 12, and the display area 13) may be the same, and the display colors of the pixel units in different display areas (the display area 11, the display area 12, and the display area 13) may be different.

The display unit 10 in FIG. 4 may be a liquid crystal display panel, and the display unit 10 may include a plurality of backlight sources in different colors (the backlight source 151, the backlight source 152, and the backlight source 153), the backlight source in each color may be disposed corresponding to each disclosed display area (the backlight source 151 may correspond to the display area 11, the backlight source 152 may correspond to the display area 12, and the backlight source 153 may correspond to the display area 13), and the color of the backlight source may be the same as the display color of pixel units in a corresponding display area. The display unit as shown in FIG. 4 may not require a color barrier layer, and only backlight sources in corresponding colors may need to be disposed in different display areas. The backlight sources may directly emit lights in corresponding colors to realize the display of color images.

The display unit in the disclosed display device may be a liquid crystal display panel, and no matter whether the liquid crystal display panel includes a color barrier layer located on the light-emitting side, the backlight sources may cover a plurality of different colors. That is, the backlight source in each color may be disposed corresponding to each display area, and the color of the backlight source may be the same as the display color of pixel units in a corresponding display area.

Figure 5:
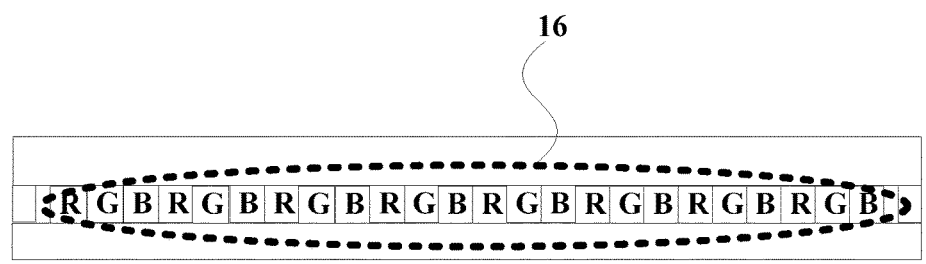
FIG. 5 illustrates an existing OLED display panel.
Figure 6:
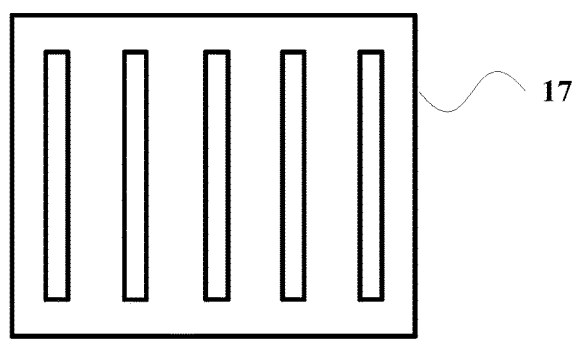
FIG. 6 illustrates an existing fine metal mask to fabricate a light emitting layer.

FIG. 5 illustrates an existing OLED display panel. As shown in FIG. 5, a light-emitting layer 16 in existing OLED devices may be fabricated via a vacuum deposition technology. The light-emitting layer 16 may consist of a red light-emitting layer R, a green light-emitting layer G or a blue light-emitting layer B. When fabricating the light-emitting layer 16, a precision metal mask 17, as shown in FIG. 6, may be used to individually deposit the red light emitting layer R, the green light emitting layer G or the blue light emitting layer B, respectively.

Because OLED devices have an increasingly high requirement on display resolution, the pixel density may also be increased, and the area occupied by each pixel unit may decrease. Accordingly, a structural requirement of the precision metal mask 17 may also be increased. However, limited by the processing difficulty of the precision metal mask and the high production cost, existing precision metal masks often cannot be used to fabricate light-emitting layers in high-resolution OLED devices.

Figure 7:
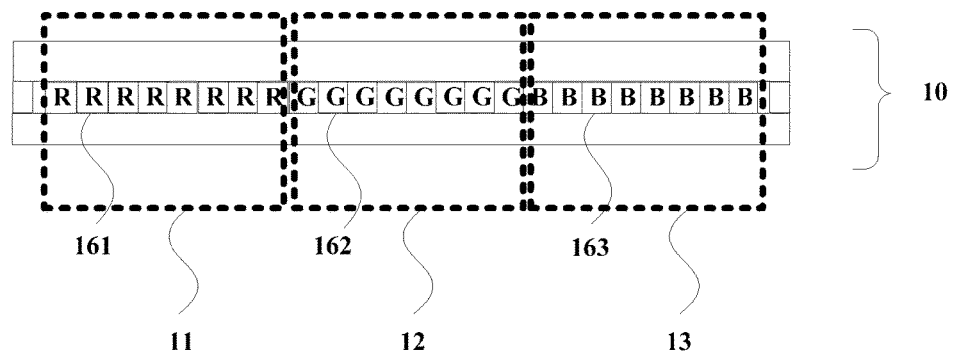
FIG. 7 illustrates another exemplary display unit consistent with disclosed embodiments.

FIG. 7 illustrates an exemplary display unit. As shown in FIG. 7, the disclosed display unit 10 may include a plurality of display areas: the display area 11, the display area 12, and the display area 13. Each display area (the display area 11, the display area 12, and the display area 13) may include a plurality of pixel units (not illustrated in FIG. 7). The display colors of pixel units in each display area (the display area 11, the display area 12, and the display area 13) may be the same, and the display colors of pixel units in different display areas (the display area 11, the display area 12, and the display area 13) may be different.

The display unit 10 in FIG. 7 may be an organic light-emitting display panel. Light-emitting colors of light-emitting layers corresponding to pixel units in each display area may be the same, and the light-emitting colors of the light-emitting layers corresponding to pixel units in different display areas may be different. The light-emitting color of the light-emitting layer 161 corresponding to the pixel units in the display area 11 may be red (R), the light-emitting color of the light-emitting layer 162 corresponding to the pixel units in the display area 12 may be green (G), and the light-emitting color of the light-emitting layer 163 in the display area 13 may be blue (B).

Thus, in the disclosed display unit illustrated in FIG. 7, the light-emitting colors of the light-emitting layers corresponding to pixel units in each display area may be the same, and the light-emitting colors of the light-emitting layers corresponding to pixel units in different display areas may be different. The light-emitting color of the light-emitting layer 161 corresponding to the pixel units in the display area 11 may be red (R), the light-emitting color of the light-emitting layer 162 corresponding to the pixel units in the display area 12 may be green (G), and the light-emitting color of the light-emitting layer 163 corresponding to the pixel units in the display area 13 may be blue (B). Accordingly, compared to the OLED display panel in FIG. 5, for the disclosed display unit illustrated in FIG. 7, when depositing a light-emitting layer, the number of deposition openings of the mask may be reduced, the precision of the deposition openings may be decreased, and the deposition openings of the required mask may correspond to an area of the display area, thus simplifying the structure of the mask and removing the need for precision processing.

Figure 8:
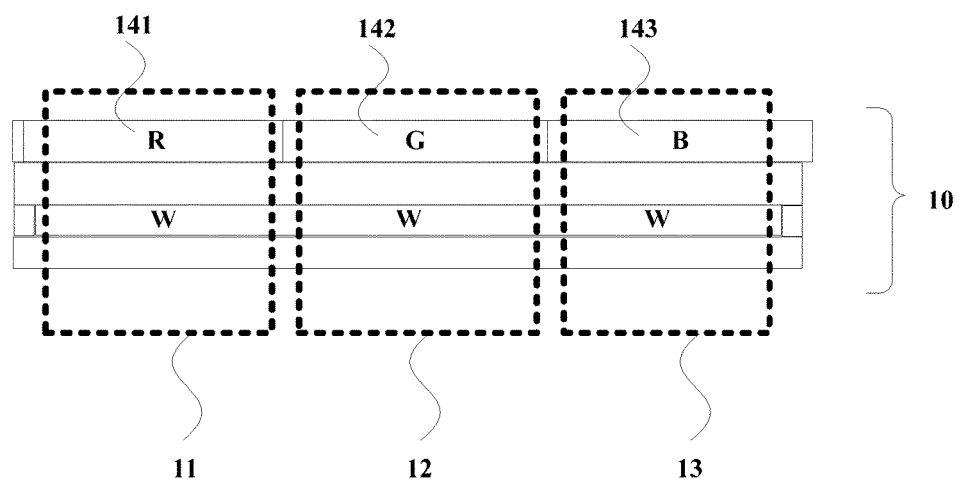
FIG. 8 illustrates another exemplary display unit consistent with disclosed embodiments.

Other than an individual light-emitting method using RGB pixel units, OLED display devices may display full colors by integrating a white light OLED with a color filter. FIG. 8 illustrates an exemplary display unit.

As shown in FIG. 8, the disclosed display unit 10 may include a plurality of display areas: the display area 11, the display area 12, and the display area 13. Each display area (the display area 11, the display area 12, and the display area 13) may include a plurality of pixel units (not illustrated in FIG. 8). The display colors of pixel units in each display area (the display area 11, the display area 12, and the display area 13) may be the same, and the display colors of pixel units in different display areas (the display area 11, the display area 12, and the display area 13) may be different.

The display unit 10 in FIG. 8 may be an organic light-emitting display panel. The light-emitting color of the light-emitting layer corresponding to pixel units in the display area 11, the display area 12, and the display area 13 may all be white (W). The display unit 10 may also include a color barrier layer 14 on the light-emitting side, and the color barrier layer 14 may include a plurality of color barrier areas in different colors (the color barrier area 141, the color barrier area 142, and the color barrier area 143). Each color barrier area may be disposed opposite to a display area (the color barrier area 141 may correspond to the display area 11, the color barrier area 142 may correspond to the display area 12, and the color barrier area 143 may correspond to the display area 13), and the color of the color barrier area may be the same as the display color of pixel units in a corresponding display area.

The arrangement of the plurality of display areas in the disclosed display unit is for illustrative purpose only, and is not intended to limit the scope of the present disclosure, as long as the first optical module may converge and overlap image lights of a plurality of display areas to form a display image. In different embodiments, the arrangement of display areas, the preset location and internal structure of the first optical module may be adjusted and, thus, the first optical module may converge and overlap image lights of the plurality of display areas to form a display image. To simplify a fabrication process, the plurality of display areas in the disclosed display unit may be sequentially arranged, and central points of the plurality of display areas may lie along a straight line.

Figure 9:
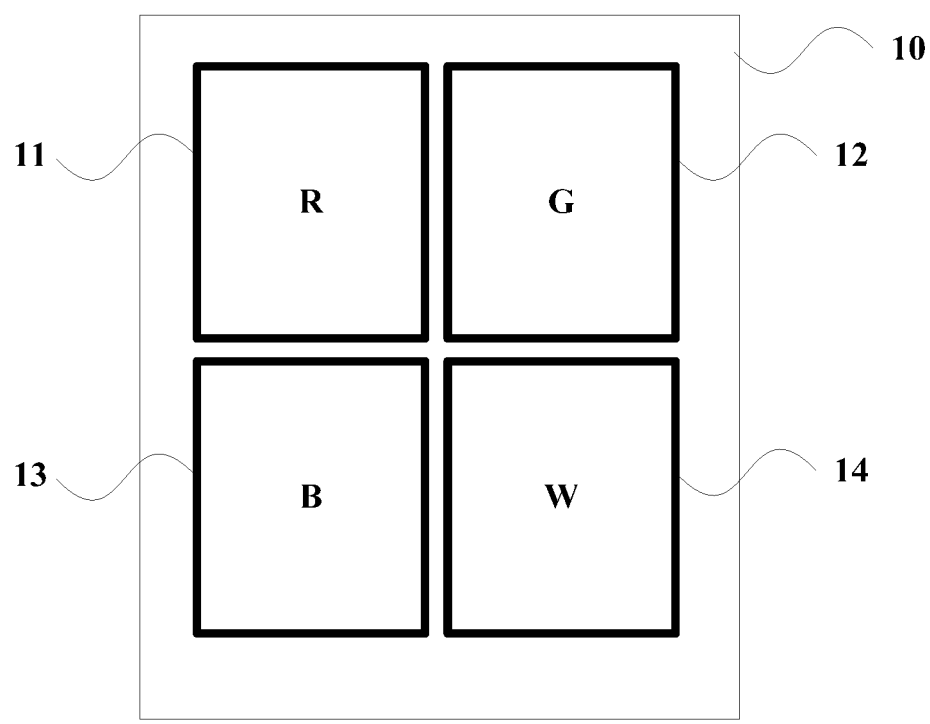
FIG. 9 illustrates an exemplary arrangement of a display area consistent with disclosed embodiments.

In other embodiments, a plurality of display areas may be arranged along a plurality of rows and a plurality of columns, as shown in FIG. 9. The display unit 10 may include four display areas: the display area 11, the display area 12, the display area 13, and the display area 14. As shown in FIG. 9, the display area may be arranged in two rows and two columns. The display color of the pixel units in the display area 11 may be red, the display color of the pixel units in the display area 12 may be green, the display color of the pixel units in the display area 13 may be blue, and the display color of the pixel units in the display area 14 may be white.

Figure 10:
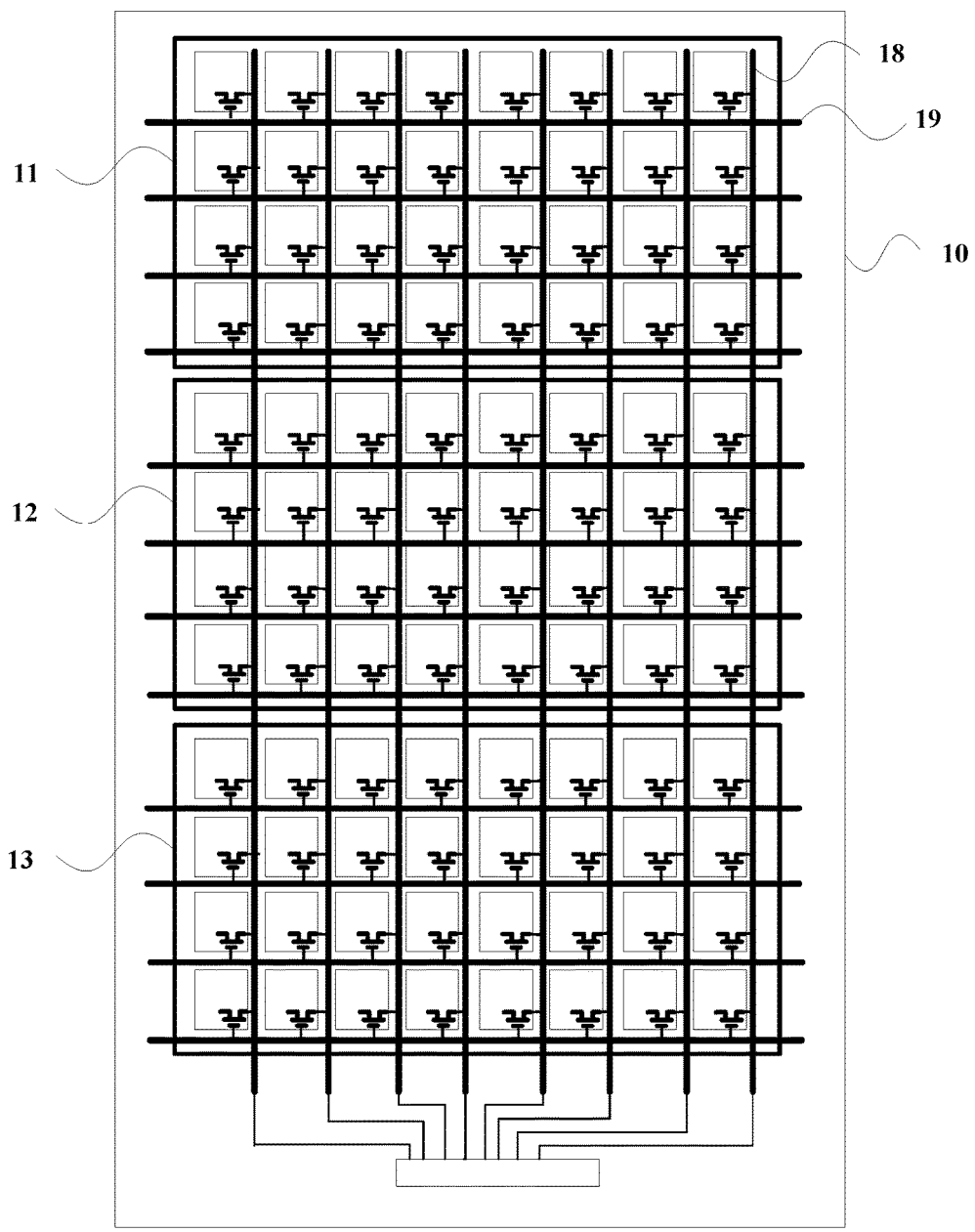
FIG. 10 illustrates another exemplary arrangement of a display area consistent with disclosed embodiments.

FIG. 10 illustrates an exemplary configuration of a display area. As shown in FIG. 10, the display unit 10 may include a plurality of data lines 18 and a plurality of scanning lines 19. The plurality of data lines 18 and the plurality of scanning lines 19 may be insulated and may define a plurality of pixel units. A plurality of display areas (the display area 11, the display area 12, and the display area 13) may be sequentially disposed along an extension direction of the data lines 18.

When displaying an image, a plurality of scanning lines 19 may sequentially input a scanning signal, and data signals of display areas in different colors may be inputted in different time periods. Specifically, a drive time of an image may be divided into a first time period, a second time period, and a third time period. Each data line 18 may provide a data signal to the display area 11 in the first time period, provide a data signal to the display area 12 in the second time period, and provide a data signal to the display area 13 in the third time period.

Figure 11:
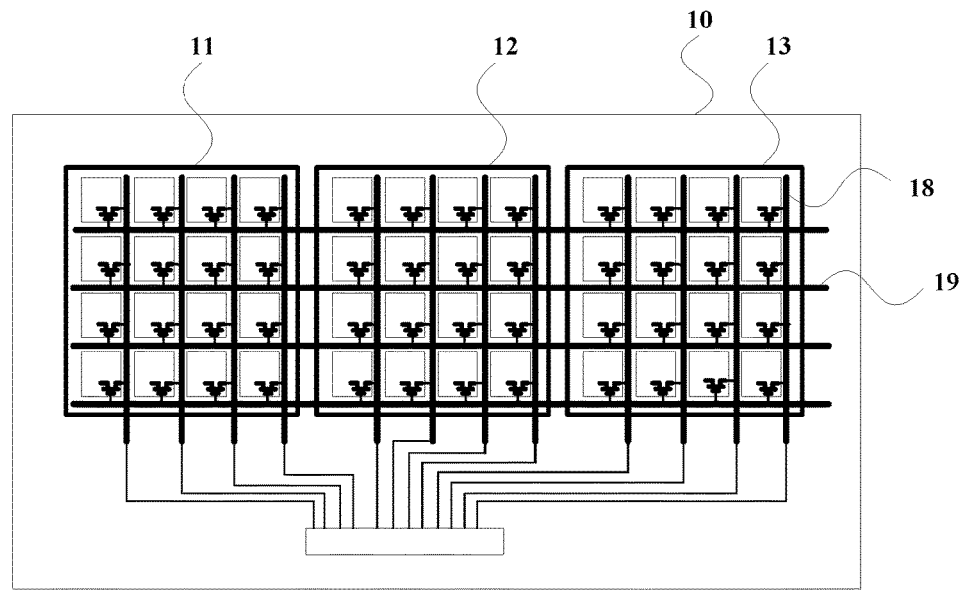
FIG. 11 illustrates another exemplary arrangement of a display area consistent with disclosed embodiments.

FIG. 11 illustrates an exemplary configuration of a display area. As shown in FIG. 11, the display unit 10 may include a plurality of data lines 18 and a plurality of scanning lines 19. The plurality of data lines 18 and the plurality of scanning lines 19 may be insulated and intersecting with each other to define a plurality of pixel units. A plurality of display areas (the display area 11, the display area 12, and the display area 13) may be sequentially disposed along an extension direction of the scanning lines 19. When displaying an image, the plurality of scanning lines 19 may sequentially input the scanning signal, data signals may simultaneously input into display areas in different colors, and data signals of display areas in different colors may not cross each other. Accordingly, an operation of the driver chip may be relatively simple.

The disclosed first optical module may include at least one reflective lens and at least one half-reflective and half-transmissive lens. Each display area may correspond to one reflective lens or one half-reflective and half-transmissive lens. The number and locations of the reflective lenses and half-reflective and half-transmissive lenses may be determined according to the number and arrangement of display areas in the display unit.

For example, when a plurality of display areas in the display unit are arranged along a plurality of rows and a plurality of columns, a reflective lens may be disposed corresponding to a first or a last display area in each row or column, and half-reflective and half-tranmissive lenses may be disposed corresponding to the other display areas in the same row or the same column. When the plurality of display areas in the display unit are sequentially arranged, and the central points of the plurality of display areas lie along a straight line, a reflective lens may be disposed corresponding to the first or the last display area arranged along the straight line, and half-reflective and half-transmissive lenses may be disposed corresponding to the other display areas.

Figure 12:
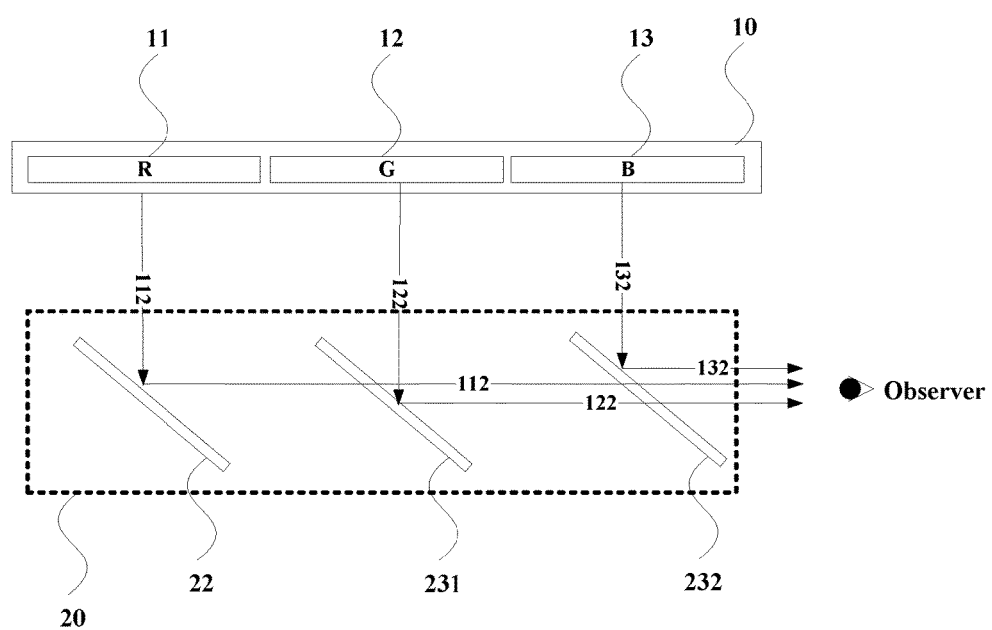
FIG. 12 illustrates another exemplary display device consistent with disclosed embodiments.

FIG. 12 illustrates an exemplary display device. As shown in FIG. 12, the display unit 10 may include three display areas: the display area 11, the display area 12, and the display area 13. The display colors of pixel units in each display area (the display area 11, the display area 12, and the display area 13) may be the same, and the display colors of pixel units in different display areas (the display area 11, the display area 12, and the display area 13) may be different. The display color of the pixel units in the display area 11 may be red (R), the display color of the pixel units in the display area 12 may be green (G), and the display color of the pixel units in the display area 13 may be blue (B).

The first optical module 20 may include a reflective lens 22, a first half-reflective and half-transmissive lens 231, and a second half-reflective and half-transmissive lens 232. The display area 11 may be disposed corresponding to the reflective lens 22, the display area 12 may be disposed corresponding to the half-reflective and half-transmissive lens 231, and the display area 13 may be disposed corresponding to the half-reflective and half-transmissive lens 232. The pixel units in the display area 11 may emit a light 112 that is reflected via the reflective lens 22, transmitted by the half-reflective and half-transmissive lens 231, and further transmitted by the half-reflective and half-transmissive lens 232. The pixel units in the display area 12 may emit a light 122 that is transmitted by the half-reflective and half-transmissive lens 231, and further transmitted by the half-reflective and half-transmissive lens 232. The pixel units in the display area 13 may emit a light 132 that is reflected by the half-reflective and half-transmissive lens 232. The light 112, the light 122, and the light 132 may converge and overlap to eventually form a display image.

To save space and simplify the structure of the first optical module 20, as shown in FIG. 12, the reflective lens 22, or the half-reflective and half-transmissive lenses 231 and 232 may be disposed right in front of the light-emitting side of the corresponding display area, respectively.

Since all display areas are disposed in a same plane, to avoid an occurrence of aberration when the image lights of each display area converge and overlap, the plane containing the reflective lens and the planes containing each half-reflective and half-transmissive lens may mutually be parallel. For example, in FIG. 12, the plane containing the reflective lens 22, the plane containing the half-reflective and half-transmissive lens 231 and the plane containing the half-reflective and half-transmissive lens 232 may mutually parallel.

By selecting locations of the reflective lens 22 and the half-reflective and half-transmissive lenses 231 and 232 in the first optical module 20, the relative location between an observer and the display unit may be adjusted. For example, when the angle between the plane containing the reflective lens 22 and the plane containing the display unit 10 is approximately 45°, the angle between the plane containing the half-reflective and half-transmissive lens 231 and the display unit 10 is approximately 45°, and the angle between the plane containing the half-reflective and half-transmissive lens 232 and the display unit 10 is also approximately 45°, the display unit 10 may not be disposed right in front of the observer, but may be disposed on either left side or right side of the observer.

The brightness of a light may change after the light traverses a reflective lens or a half-reflective and half-transmissive lens in the first optical module, resulting in a distortion of the display image formed by light converging and overlapping. For example, in FIG. 12, the brightness of the light 112 may be A1 when the light 112 reaches the reflective lens 22. The light 112 may continue to reach the half-reflective and half-transmissive lens 231 where partial light 112 may be transmitted and partial light 112 may be reflected and lost. The brightness of the light 112 after transmitted by the half-reflective and half-transmissive lens 231 may be B1. Further, the light 112 may continue to reach the half-reflective and half-transmissive lens 232 where partial light 112 may be transmitted and partial light 112 may be reflected and lost. The brightness of the light 112 after transmitted by the half-reflective and half-transmissive may be C1, and A1>B1>C1.

The brightness of the light 122 may be A2 when the light 122 reaches the half-reflective and half-transmissive lens 231 where partial light 122 is reflected to reach the half-reflective and half-transmissive lens 232 and partial light 122 is transmitted and lost. The brightness of the light 122 may be B2 when the light 122 reaches the half-reflective and half-transmissive lens 232 where partial light 122 is transmitted by the half-reflective and half-transmissive lens 232 and partial light 122 is reflected by the half-reflective and half-transmissive lens 232. The brightness of the light 122 after transmitted by the half-reflective and half-transmissive lens 232 may be C2, and A2>B2>C2.

The brightness of the light 132 may be A3 when the light 132 reaches the half-reflective and half-transmissive lens 232 where partial light 132 is reflected by the half-reflective and half-transmissive lens 232, and partial light 132 is transmitted by the half-reflective and half-transmissive lens 232 and lost. The brightness of the light 132 after reflected by the half-reflective and half-transmissive lens 232 may be C3, and A3>C3.

If A1=A2=A3, a condition that C1, C2, and C3 are not equal may occur after the lights 112, 122 and 132 traverse the reflective lens 22, the half-reflective and half-transmissive lens 231, and the half-reflective and half-transmissive lens 232.

In one embodiment, the maximum brightness of image lights of a plurality of display areas after traversing the disclosed first optical module may be controlled and adjusted to be the same, i.e., C1=C2=C3, thus avoiding the issue that images may be distorted because the lights lose the brightness in the first optical module. A plurality of methods may be applied to control and adjust image lights of the plurality of display areas to have the same maximum brightness after traversing the first optical module.

In one embodiment, according to the optical properties (i.e., reflectivity and refractivity) of various reflective lenses and half-reflective and half-transmissive lenses in the first optical module, the display brightness of pixel units in different display areas may be controlled and adjusted via an external control circuit or a driver chip, thus controlling the maximum brightness of image lights of a plurality of display areas to be the same after traversing the disclosed first optical module.

In one embodiment, the brightness of backlight sources corresponding to different display areas may be adjusted to control the maximum brightness of image lights of a plurality of display areas to be the same after traversing the disclosed first optical module.

In one embodiment, the areas ratios of each display area in the display unit may be adjusted or the reflective lenses and half-reflective and half-transmissive lenses with proper optical properties may be selected to control the maximum brightness of image lights of a plurality of display areas to be the same after traversing the disclosed first optical module.

The shape of the display area may be rectangular, circular, oval, polygonal, or irregular. Further, the shape of the display area is only for illustrative purposes, and is not intended to limit the scope of the present disclosure. Since the display colors of pixel units in the display area may be different, the first optical module may show different reflectivities and refractivities for lights in different colors, and if the areas of a plurality of display areas are the same, a phenomenon of chromatic dispersion may easily occur.

In one embodiment, to avoid the chromatic dispersion, area sizes of the plurality of display areas may be different, and each area size of the display area may be proportional to a wavelength of the display color of pixel units in a corresponding display area.

Figure 13:
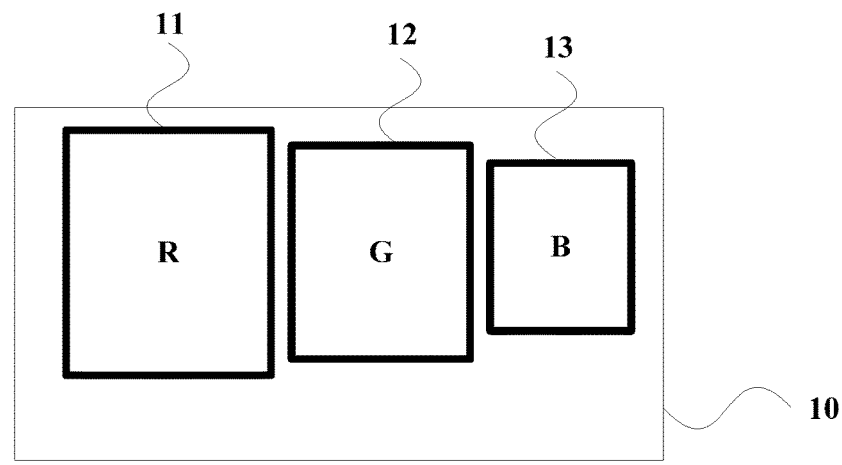
FIG. 13 illustrates another exemplary display unit consistent with disclosed embodiments.

FIG. 13. illustrates an exemplary display unit. As shown in FIG. 13, the display color of the pixel units in the display area 11 may be red (R), the display color of the pixel units in the display area 12 may be green (G), and the display color of the pixel units in the display area 13 may be blue (B). The wavelength of red lights may be larger than the wavelength of green lights, and the wavelength of green lights may be larger than the wavelength of blue lights. Accordingly, the area size of the display area 11 may be larger than the area size of the display area 12, and the area size of the display area 12 may be larger than the area size of the display area 13.

A plurality of methods may be applied to set areas for a plurality of display areas. For example, distances between adjacent pixel units in the plurality of display areas may be different, or areas of pixel units in different display areas may be different.

Figure 14:
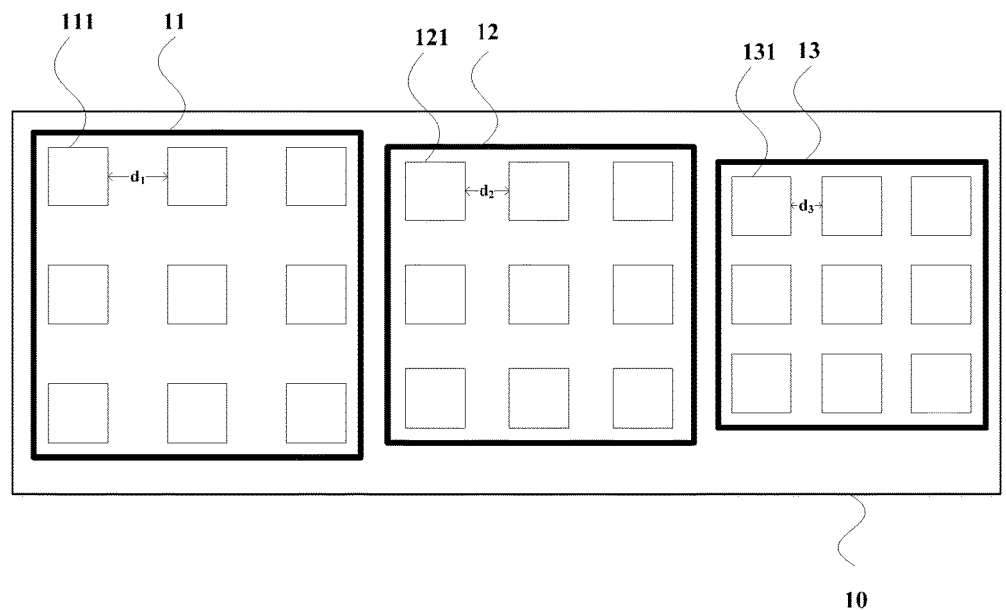
FIG. 14 illustrates another exemplary display unit consistent with disclosed embodiments.

FIG. 14 illustrates an exemplary display unit. As shown in FIG. 14, the display color of the pixel units in the display area 11 may be red (R), the display color of the pixel units in the display area 12 may be green (G), and the display color of the pixel units in the display area 13 may be blue (B). The wavelength of the red lights may be larger than the wavelength of the green lights, and the wavelength of the green lights may be larger than the wavelength of the blue lights. The distance $d_1$ between adjacent pixel units 111 in the display area 11 may be longer than the distance $d_2$ between adjacent pixel units 121 in the display area 12. The distance $d_2$ between adjacent pixel units 121 in the display area 12 may be longer than the distance $d_3$ between adjacent pixel units 131 in the display area 13.

Figure 15:
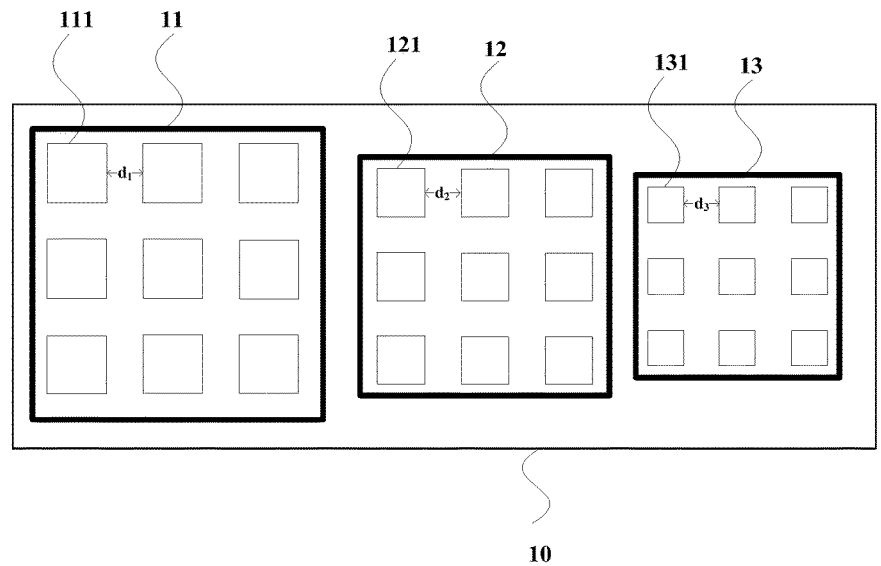
FIG. 15 illustrates another exemplary display unit consistent with disclosed embodiments.

FIG. 15 illustrates an exemplary display unit. As shown in FIG. 15, the display color of the pixel units 111 in the display area 11 may be red (R), the display color of the pixel units 121 in the display area 12 may be green (G), and the display color of the pixel units 131 in the display area 13 may be blue (B). The wavelength of the red lights may be longer than the wavelength of the green lights, and the wavelength of the green lights may be longer than the wavelength of the blue lights. The distance $d_1$ between adjacent pixel units 111 in the display area 11, the distance $d_2$ between adjacent pixel units 121 in the display area 12, and the distance $d_3$ between adjacent pixel units 131 in the display area 13 may be the same. Further, the area of each pixel unit 111 in the display area 11 may be larger than the area of each pixel unit 121 in the display area 12, and the area of each pixel unit 121 in the display area 12 may be larger than each pixel unit 131 in the display area 13.

Figure 16:
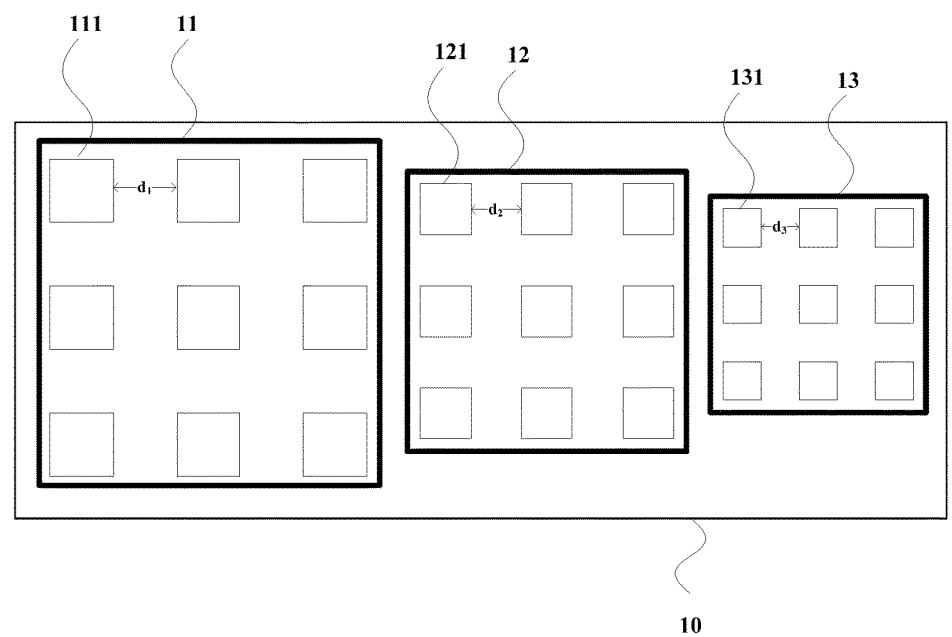
FIG. 16 illustrates another exemplary display unit consistent with disclosed embodiments.

FIG. 16 illustrates another exemplary display unit. As shown in FIG. 16, the display color of the pixel units 111 in the display area 11 may be red (R), the display color of the pixel units 121 in the display area 12 may be green (G), and the display color of the pixel units 131 in the display area 13 may be blue (B). The wavelength of the red lights may be larger than the wavelength of the green lights, and the wavelength of the green lights may be larger than the wavelength of the blue lights. The distance $d_1$ between adjacent pixel units 111 in the display area 11 may be longer than the distance $d_2$ between adjacent pixel units 121 in the display area 12, and the distance $d_2$ between adjacent pixel units 121 in the display area 12 may be longer than the distance $d_3$ between adjacent pixel units 131 in the display area 13. Further, the area of each pixel unit 111 in the display area 11 may be larger than the area of each pixel unit 121 in the display area 12, and the area of each pixel unit 121 in the display area 12 may be larger than the area of each pixel unit 131 in the display area 13.

In one embodiment, a head-mounted display device may include any of above display device. The disclosed head-mounted display device may isolate a user from an outside environment, and induce the user to have a feeling in a visual environment, thus bringing the user a full sense of immersion. The disclosed head-mounted display device may be a visual reality helmet, or a pair of visual reality glasses.

The structure of the disclosed head-mounted display device may be simple. Specifically, the display unit may be divided into a plurality of display areas to form relatively independent images in different display colors. Via a first optical module, the relatively independent images in different display colors may converge and overlap to form display images to improve the resolution of the display device. Accordingly, the issue that existing visual display devices often generate images that are granular may be solved, and the image quality may be improved.

Optionally, the areas of a plurality of display areas in the display device of a head-mounted display apparatus may be different and proportional to optical path lengths of image lights of the display areas. The optical path length of an image light may refer to a path length of a light travels from the light-emitting side of the display area to human eyes.

Figure 17:
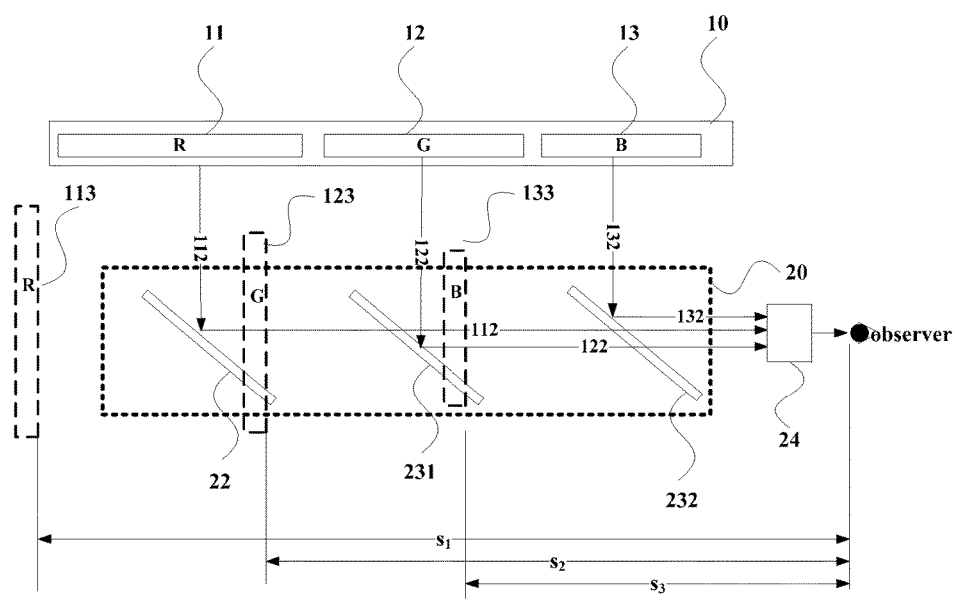
FIG. 17 illustrates an exemplary internal structure of a head-mounted display device consistent with disclosed embodiments.

FIG. 17 illustrates an exemplary internal structure of a head-mounted display device. As shown in FIG. 17, since the first optical module in the display device may reflect or transmit lights from different display areas, the locations of visual images corresponding to different display areas may be different. The distance between a visual image 113 corresponding to the display area 11 and human eyes, the distance between a visual image 123 corresponding to the display area 12 and human eyes, and the distance between a visual image 133 corresponding to the display area 13 and human eyes may be different, and the optical paths of image lights from different display areas may also be different. An optical path of the image light from the display area 11 may be $S_1$, an optical path of the image light from the display area 12 may be $S_2$, and an optical path of the image light from the display area 13 may be $S_3$. $S_1 > S_2 > S_3$.

The area sizes of the disclosed plurality of display areas may be different and proportional to the optical path lengths of image lights from corresponding display areas to remove the aberration issue induced by the difference in optical path lengths of image lights from different display areas. As shown in FIG. 17, the area size of the display area 11 may be larger than the area size of the display area 12, and the area size of the display area 12 may be larger than the area size of the display area 13. In some other embodiments, the area sizes of different display areas may be configured according to specific requirements of the optical paths.

Optionally, as shown in FIG. 17, the disclosed head-mounted display device may include a second optical module 24, and the second optical module may be configured to enlarge the display image. The second optical module 24 may, for example, include a plurality of lens systems.

Figure 18:
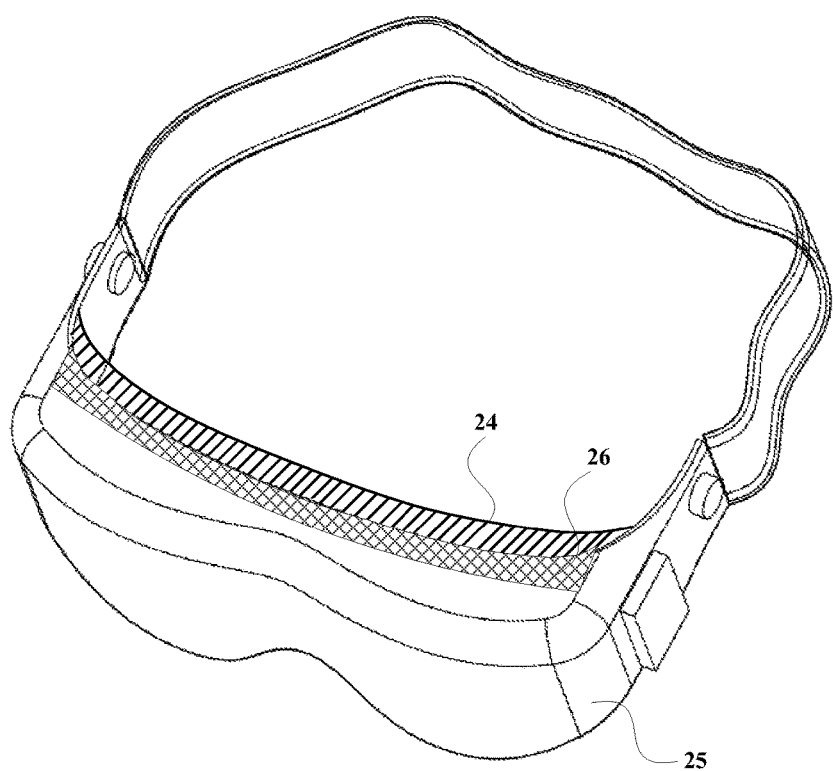
FIG. 18 illustrates an exemplary appearance of a head-mounted display device consistent with disclosed embodiments.

FIG. 18 illustrates an exemplary appearance of a head-mounted display device. As shown in FIG. 18, the disclosed head-mounted display device may also include a braced frame 25 and a display device 26. The second optical module 24 may be located inside the braced frame 25.

Figure 19:
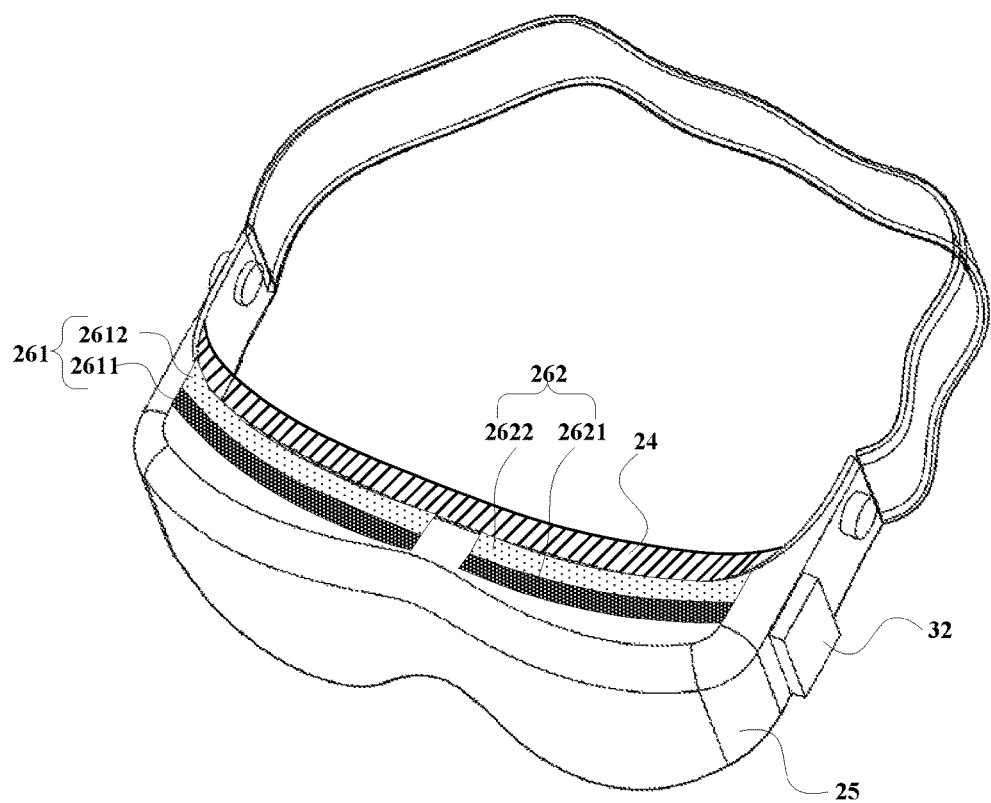
FIG. 19 illustrates an exemplary pair of head-mounted visual display glasses consistent with disclosed embodiments.

The disclosed head-mounted display device may include a plurality of display devices. FIG. 19 illustrates an exemplary pair of head-mounted visual reality glasses. As shown in FIG. 19, the pair of head-mounted visual reality glasses may include two display devices: a display device 261 and a display device 262. The display device 261 may include a display unit 2611 and a first optical module 2612. The display device 262 may include a display unit 2621 and a second optical module 2622.

A pair of head-mounted visual reality glasses may include other components to support normal operation of the glasses, for example, a central processing unit 32. The central processing unit 32 may send first data information and second data information, respectively, to the display unit 2611 and the display unit 2621 for display.

The display unit 2611 may form an image, after the image is converged and overlapped via the first optical module 2612, a display image may form and enter a human eye via the second optical module 24. The display unit 2621 may form an image, after the image is converged and overlapped via the first optical module 2622, a display image may form and enter the other human eye via the second optical module 24.

In operation, one eye of the user may receive the image content of the display unit 2611, and the other eye of the user may receive the image content of the display unit 2621. Due to binocular parallax, the user may have a feeling of being in a 3D environment. The disclosed pair of head-mounted visual reality glasses may include two display devices, a left eye and a right eye of the user may see contents corresponding to different display devices, respectively, thus realizing a 3D effect.

The embodiments disclosed herein are exemplary only and not limiting the scope of this disclosure. Various combinations, alternations, modifications, or equivalents to the technical solutions of the disclosed embodiments can be obvious to those skilled in the art and can be included in this disclosure. Without departing from the spirit and scope of this invention, such other modifications, equivalents, or improvements to the disclosed embodiments are intended to be encompassed within the scope of the present disclosure.

What is claimed is:

1. A display device, comprising:
 a display unit and a first optical module, wherein the first optical module includes at least one reflective lens and at least one half-reflective and half-transmissive lens, wherein:
 the display unit further comprises a plurality of display areas,
 each display area includes a plurality of pixel units,
 display colors of pixel units in each display area are the same,
 the display colors of pixel units in different display areas are different,
 the first optical module converges and overlaps image light of the plurality of display areas to form a display image,
 the plurality of display areas are sequentially arranged, and central points of the plurality of display areas are located along a straight line, and
 each display area corresponds to one reflective lens or one half-reflective and half-transmissive lens.

2. The display device according to claim 1, wherein a same number of pixel units are included in each of the plurality of display areas.

3. The display device according to claim 1, wherein the display unit is a liquid crystal display panel, and the pixel units are in a square shape, a rectangle shape, or a circular shape.

4. The display device according to claim 3, wherein the liquid crystal display panel includes a color filter layer on a light-emitting side, and the color filter layer further includes:
 a plurality of color filter areas in different colors, each color filter area is disposed in correspondence to one display area, and a color of the color filter area is the same as the display color of pixel units in a corresponding display area.

5. The display device according to claim 4, wherein the liquid crystal display panel includes:
 a backlight source, a light-emitting color of the backlight source being white.

6. The display device according to claim 3, wherein:
 the liquid crystal display panel further comprises backlight sources in a plurality of different colors,
 the backlight source in each color is disposed in correspondence to one display area, and
 the color of the backlight source is same as the display color of pixel units in the corresponding display area.

7. The display device according to claim 1, wherein the display unit is an organic light-emitting display panel having a plurality of light-emitting layers, light-emitting colors of the light-emitting layers corresponding to the pixel units in each display area are the same, and the light-emitting colors of the light-emitting layers corresponding to the pixel units in different display areas are different.

8. The display device according to claim 1, wherein:
 the display device is an organic light-emitting display panel having a plurality of light-emitting layers, and light-emitting color of the light-emitting layer corresponding to the pixel units in the display area is white; and
 the organic light-emitting display panel further comprising:
 a color filter layer on a light-emitting side, wherein the color filter layer includes a plurality of color filter areas in different colors, each color filter area is disposed in correspondence to one display area, and a color of the color filter area is the same as the display color of the pixel units in the corresponding display area.

9. The display device according to claim 1, wherein the display unit includes a plurality of data lines and a plurality of scanning lines, and the plurality of data lines and the plurality of scanning lines are insulated and intersecting with each other to define the plurality of pixel units in the display areas;
 the plurality of display areas are sequentially disposed along an extension direction of data lines or along an extension direction of scanning lines.

10. The display device according to claim 1, wherein the reflective lens or the half-reflective and half-transmissive lens is located right in front of a light-emitting side of the display area.

11. The display device according to claim 1, wherein a plane containing the reflective lens and planes containing the half-reflective and half-transmissive lenses are mutually parallel, and an angle between the plane containing the reflective lens and a plane containing the display unit is approximately 45°.

12. The display device according to claim 1, wherein a maximum brightness of image lights from each of the plurality of display areas is the same after the image lights traverse the first optical module.

13. The display device according to claim 1, wherein:
area sizes of the plurality of display areas are different and proportional to wavelengths of the display colors of the pixel units in the corresponding display areas;
distances between adjacent pixel units in a plurality of display areas are different and proportional to the wavelengths of the display colors of the pixel units in the corresponding display areas; and
area sizes of pixel units in different display areas are different and proportional to the wavelengths of the display colors of the pixel units in the corresponding display areas.

14. The display device according to claim 1, wherein a number of the display area is three, and the display colors of the pixel units in each display area are red, green and blue, respectively.

15. A head-mounted display device, comprising:
a display device including a display unit and a first optical module, wherein the first optical module includes at least one reflective lens and at least one half-reflective and half-transmissive lens,
wherein:
the display unit further comprises a plurality of display areas,
each display area includes a plurality of pixel units,
display colors of pixel units in each display area are the same,
the display colors of pixel units in different display areas are different,
the first optical module converges and overlaps image light of the plurality of display areas to form a display image,
the plurality of display areas are sequentially arranged, and central points of the plurality of display areas are located along a straight line, and
each display area corresponds to one reflective lens or one half-reflective and half-transmissive lens.

16. The head-mounted display device according to claim 15, wherein the areas of the plurality of display areas are different and proportional to optical path lengths of the image light from the display areas, and an optical path length refers to a path length of light travels from a light-emitting side of a display area to the human eye.

17. The head-mounted display device according to claim 15, further comprising:
a second optical module enlarges the display image, wherein the second optical module includes a plurality of lens systems.

18. The head-mounted display device according to claim 17, further comprising:
a braced frame, wherein the second optical module and the display device are located inside the braced frame.

* * * * *